United States Patent
Kim et al.

(10) Patent No.: US 10,884,056 B2
(45) Date of Patent: Jan. 5, 2021

(54) SYSTEM-ON-CHIP INCLUDING CPU OPERATING AS DEBUG HOST AND METHOD OF OPERATING THE SAME

(71) Applicant: SAMSUNG ELECTRONICS CO., LTD., Suwon-si (KR)

(72) Inventors: Ho-sung Kim, Hwaseong-si (KR); Chang-ki Kim, Seoul (KR); Byeong-jin Kim, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 199 days.

(21) Appl. No.: 15/817,689

(22) Filed: Nov. 20, 2017

(65) Prior Publication Data

US 2018/0224504 A1 Aug. 9, 2018

(30) Foreign Application Priority Data

Feb. 6, 2017 (KR) .................. 10-2017-0016403

(51) Int. Cl.
*G01R 31/317* (2006.01)
*G01R 31/3177* (2006.01)
*G06F 11/22* (2006.01)
*G06F 11/36* (2006.01)
*G06F 11/34* (2006.01)

(52) U.S. Cl.
CPC ... *G01R 31/31705* (2013.01); *G01R 31/3177* (2013.01); *G06F 11/2236* (2013.01); *G06F 11/2242* (2013.01); *G06F 11/3466* (2013.01); *G06F 11/3648* (2013.01)

(58) Field of Classification Search
CPC ............. G06F 11/2236; G06F 11/3466; G06F 11/3648; G06F 11/3636
See application file for complete search history.

(56) References Cited

U.S. PATENT DOCUMENTS

| | | | |
|---|---|---|---|
| 6,145,007 A * | 11/2000 | Dokic | G06F 13/4022 709/230 |
| 6,145,099 A | 11/2000 | Shindou | |
| 6,732,311 B1 | 5/2004 | Fischer et al. | |
| 6,826,713 B1 * | 11/2004 | Beesley | G06F 11/3636 713/2 |
| 7,913,118 B2 | 3/2011 | Shih et al. | |
| 9,158,661 B2 | 10/2015 | Blaine et al. | |
| 2004/0017219 A1 * | 1/2004 | Han | G01R 31/31705 326/16 |
| 2008/0215923 A1 * | 9/2008 | Bueti | G06F 30/33 714/39 |
| 2013/0198566 A1 | 8/2013 | Bastimane et al. | |
| 2013/0238933 A1 | 9/2013 | Shin | |

(Continued)

FOREIGN PATENT DOCUMENTS

KR 10-2013-0101927 A 9/2013

*Primary Examiner* — Jigar P Patel
(74) *Attorney, Agent, or Firm* — Lee IP Law, PC

(57) ABSTRACT

Provided is a method of operating a system-on-chip (SoC) including a plurality of CPUs. The method includes: receiving a debug request by a first CPU of the CPUs; outputting a first signal to the CPUs by the first CPU in response to the debug request; selecting a second CPU from the CPUs to control the debugging based on the first signal; and performing a debug operation by selecting a debug target block by the second CPU.

17 Claims, 13 Drawing Sheets

(56) References Cited

U.S. PATENT DOCUMENTS

2013/0326539 A1* 12/2013 Otani .................. G06F 11/3024
                                                    719/313
2014/0157073 A1*  6/2014 Douskey ............ G01R 31/3177
                                                    714/732
2015/0121152 A1   4/2015 Chen et al.

* cited by examiner

SYSTEM-ON-CHIP INCLUDING CPU OPERATING AS DEBUG HOST AND METHOD OF OPERATING THE SAME

CROSS-REFERENCE TO RELATED APPLICATION

Korean Patent Application No. 10-2017-0016403, filed on Feb. 6, 2017, and entitled, "System-On-Chip Including CPU Operating as Debug Host and Method of Operating the Same," is incorporated by reference herein in its entirety.

BACKGROUND

1. Field

One or more embodiments described herein relates to a System-on-Chip (SoC) including a central processing unit (CPU) operating as a debug host and a method for operating a CPU.

2. Description of the Related Art

When a computing system is operated, the computer system may hang for various reasons. In some cases, an inoperable state of the CPU may occur. A debug operation may be performed in an attempt to find the cause of the hang or to correctly analyze the problem. The debug operation may be performed by connecting an external debugger to the computing system through an external debug interface. The external debug interface increases costs and places a limitation on the extent to which debugging functions can be performed.

SUMMARY

In accordance with one or more embodiments, a method of operating a system-on-chip (SoC) including central processing units (CPUs) includes receiving a debug request by a first CPU of the CPUs; outputting a first signal to the CPUs by the first CPU based on the debug request; selecting a second CPU from the CPUs to control debugging based on the first signal; and performing a debug operation by selecting a debug target block by the second CPU.

In accordance with one or more other embodiments, a system-on-chip includes a plurality of first functional blocks; a plurality of second functional blocks respectively including an event generation logic to output an event signal to initiate debugging and a debug performing logic to perform a debug operation with respect to at least one of the plurality of second functional blocks; and a debug control logic to receive the event signal from the one of the plurality of second functional blocks and to broadcast the event signal to the plurality of second functional blocks, wherein the one of the plurality of second functional blocks is to perform a debug operation with respect to a debug target block selected from the plurality of first functional blocks or the plurality of second functional blocks based on the broadcasted event signal.

In accordance with one or more other embodiments, a system-on-chip includes a plurality of processors; a memory to store debugging code; and logic to control a first processor of the plurality of processors to perform a debug operation based on the debugging code.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
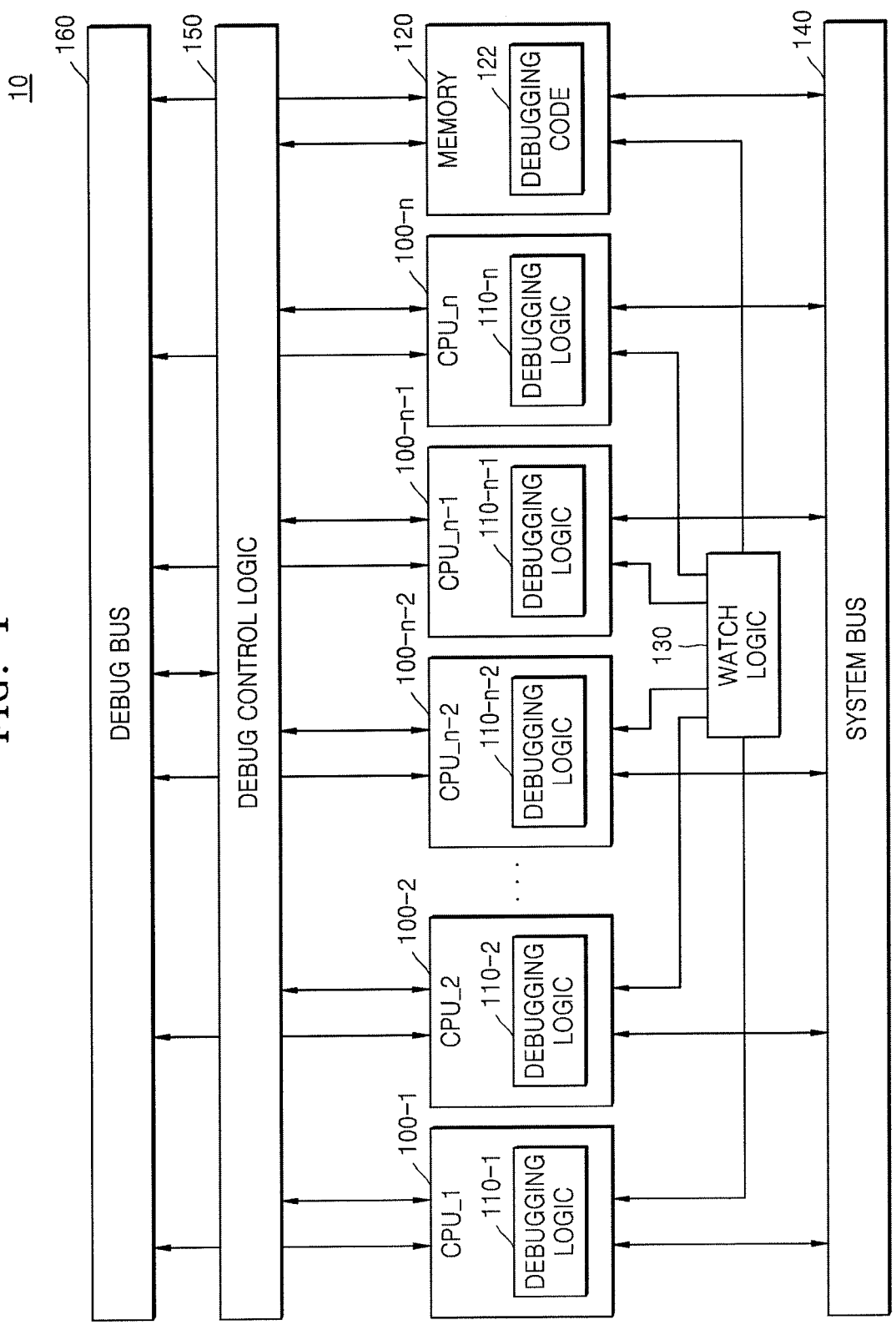
FIG. 1 illustrates an embodiment of a semiconductor chip.

FIG. 1 illustrates an embodiment of a semiconductor chip 10 which may include a plurality of central processing units (CPUs) 100-1~100-$n$, a memory 120, a watch logic 130, a system bus 140, a debug control logic 150, and a debug bus 160. The functional blocks may be divided, for example, into a first functional block and a second functional block. The first functional block may be, for example, the memory 120, the watch logic 130, the system bus 140, the debug control logic 150, or the debug bus 160. The second functional block may be, for example, the CPUs 100-1~100-$n$.

The semiconductor chip 10 may be a System-on-Chip (SoC). The SoC may be realized as a printed circuit board (e.g., a mother-board), an integrated circuit (IC), a processor, a multimedia processor, or an integrated multimedia processor. In one embodiment, the SoC may be an application processor. The semiconductor chip 10 may further include various other elements, for example, based on the intended application.

The CPUs 100-1~100-$n$ may respectively execute process programs and/or data stored in the memory 120. The CPUs 100-1~100-$n$ may respectively include a decoder for decoding received commands from an external source, control logic for controlling operational performance corresponding to the decode commands, computation logic for performing a predetermined computation operation according to the control of the control logic, and a plurality of registers for storing register information.

The CPUs 100-1~100-$n$ may respectively include debugging logic. According to the example embodiment, each of the CPUs 100-1~100-$n$ may output an event signal for initiating debugging through debugging logics 110-1~110-$n$.

In the present example embodiment, CPUs 100-1~100-$n$ may serve as debug hosts and may perform debug operations through debugging logic 110-1~110-$n$. The debugging logic 110-1~110-$n$ may perform debugging operations based on, for example, debugging code 122 stored in the memory 120. In one example embodiment, debugging logic 110-1~110-$n$ may perform debugging operations based on debugging code stored in internal memories of the CPUs 100-1~100-$n$.

In an example embodiment, CPUs 100-1~100-$n$ may be specific-purpose CPUs (e.g., digital signal processors (DSPs), sensor CPU, etc.) in addition to CPUs for main core performance. Each of the specific-purpose CPUs may include a CPU memory for storing debugging code. In the present example embodiment, when one of the specific purpose CPUs serving as a debug host performs a debugging operation, the debugging operation may be performed based on a debugging code stored in a CPU memory.

The memory 120 may temporarily store programs, data, or commands. For example, programs and/or data stored in a storage area may be temporarily stored in the memory 120 according to the control of at least one of the CPUs 100-1~100-n. The memory 120 may be, for example, a dynamic random access memory (DRAM) or a static RAM (SRAM).

The memory 120 may further store the debugging code 122 for performing a debug operation. The memory 120 may store the debugging code 122 by receiving the debugging code 122 from the storage area. In the present example embodiment, the debugging code 122 may be a base of a debug operation when one of the CPUs 100-1~100-n as a debug host performs the debug operation.

The watch logic 130 may detect an operable state or inoperable state of the CPUs 100-1~100-n or a hang state or a malfunction state of the SoC. The hang state or the malfunction state of the SoC may denote, for example, a case when a hang or malfunction occurs respectively in the memory 120 and/or the system bus 140.

The watch logic 130 may periodically receive reset signals from the functional blocks in the semiconductor chip 10, and may watch the operable state or inoperable state of the CPUs 100-1~100-n or a hang state or a malfunction state of the SoC based on the received reset signals. In the present example embodiment, when at least one of the CPUs 100-1~100-n is in an inoperable state or the SoC is in a hang state or a malfunction state, the watch logic 130 may output an interruption signal to the at least one of the CPUs 100-1~100-n. In the present example embodiment, the watch logic 130 may output an interruption signal to the at least one of the CPUs 100-1~100-n through an independent connection, which, in one embodiment, may be different from the system bus 140 or the debug bus 160.

The system bus 140 may connect the functional blocks in the semiconductor chip 10 to each other. For example, the system bus 140 may include an AR (read address) channel, an AW (write address) channel, a B (write response) channel, an R (read response) channel, or a W (write data) channel defined in an AXI4 specification. The system bus 140 may be a protocol having a predetermined standard bus specification. The protocol having a standard bus specification may be, for example, an advanced microcontroller bus architecture (AMBA) protocol of the advanced RISC machine (ARM) Co.

Debug control logic 150 may receive an event signal output from one of the CPUs 100-1~100-n for initiating debugging, and may broadcast the event signal to the CPUs 100-1~100-n. In the present example embodiment, debug control logic 150 may include a plurality of debug control interfaces connected to the functional blocks in the semiconductor chip 10 and a debug control matrix that connects the debug control interfaces to each other.

When a debug operation is performed, debug control logic 150 may receive a request from the CPU which is a debug host and may control debug target blocks based on the request of the CPU. For example, when the CPU serving as a debug host requests information of the debug target blocks, the debug control logic 150 may control the debug target blocks to provide information to the CPU serving as a debug host based on the request of the CPU.

When a debug operation is performed, debug control logic 150 may receive a request from the CPU serving as a debug host and may control the memory 120 based on the request of the CPU. For example, when the CPU serving as a debug host requests the debugging code 122 based on a debug operation, debug control logic 150 may control the memory 120 to provide information to the CPU which is a debug host based on the request of the CPU.

Also, when a debug operation is performed, debug control logic 150 may limit operations beside the debug operation with respect to the connected functional blocks. For example, debug control logic 150 may stop operations beside the debug operation with respect to the CPUs 100-1~100-n.

When a debug operation is performed, the debug bus 160 may connect the CPU serving as a debug host, the debug target block, and/or the memory 120 to each other. For example, the debug bus 160 may be another SoC having an advanced peripheral bus (APB) or a similar function to the APB.

Figure 2A:
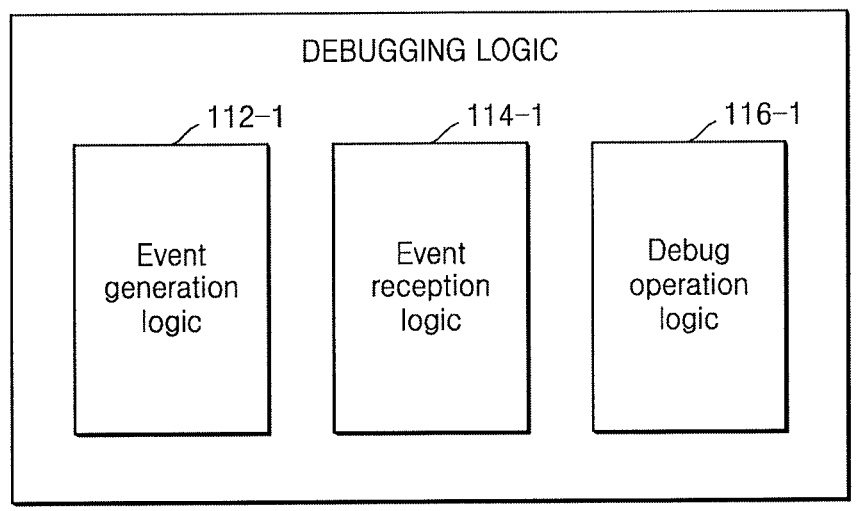
FIG. 2A illustrates an embodiment of practical debugging logic.

FIG. 2A illustrates an embodiment of practical debugging logic 110-1 which may include an event generation logic 112-1, an event receiving logic 114-1, and a debug performing logic 116-1.

Referring to FIG. 1, event generation logic 112-1 may output an event signal for initiating a debugging. In the present example embodiment, event generation logic 112-1 may receive a command from a user interface and may output an event signal based on the command. In the present example embodiment, event generation logic 112-1 may receive an interruption signal from the watch logic 130 and may output an event signal based on the interruption signal.

The event receiving logic 114-1 may receive, for example, a broadcasted event signal from debug control logic 150. The broadcasted event signal may be, for example, an event signal output from a different CPU besides the CPU including the debugging logic 110-1. In the present example embodiment, when the event receiving logic 114-1 receives the broadcasted event signal from the debug control logic 150 earlier than other CPUs, the event receiving logic 114-1 may output an initiating signal to the debug performing logic 116-1.

When the debug performing logic 116-1 receives the initiating signal from the event receiving logic 114-1, a debugging operation may be performed with respect to the selected debug target blocks on the functional blocks in the semiconductor chip 10. In the present example embodiment, the debug performing logic 116-1 may perform a debug operation based on the debugging code 122 stored in the memory 120. In the present example embodiment, the debug performing logic 116-1 may perform a debug operation based on a debugging code stored in a CPU memory.

Figure 2B:
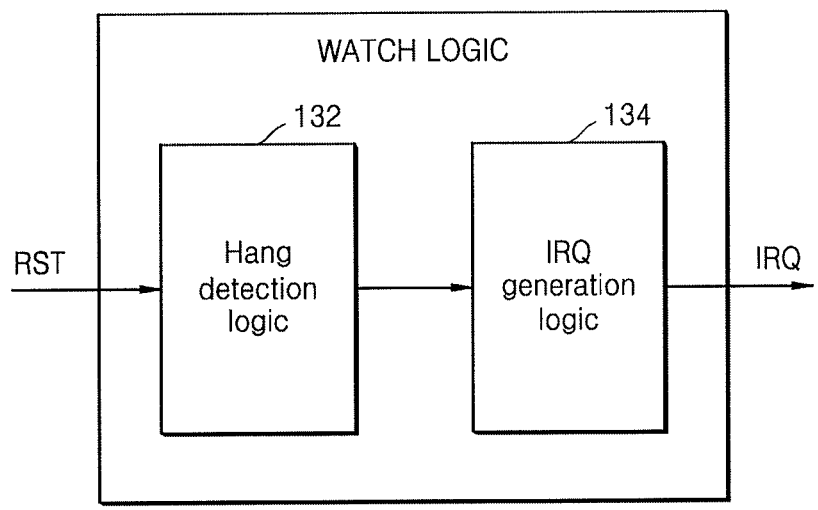
FIG. 2B illustrates an embodiment of practical watch logic.

FIG. 2B illustrates an embodiment of practical watch logic 130 which may include a hang detection logic 132 and an interrupt generation logic 134. The hang detection logic 132 may detect an operable state or inoperable state of the CPUs 100-1~100-n and a hang state or a malfunction state of the SoC.

In the present example embodiment, the hang detection logic 132 may include at least one clock and at least one counter for counting an output of the clock. The hang detection logic 132 may receive reset signals (RSTs) at given periods from each of the functional blocks connected to each other.

The hang detection logic 132 may determine whether a reset signal RST is received or not within a predetermined period through the clock and the counter. When a reset signal RST is received in a predetermined period, the count value of the clock may be reset. When a reset signal RST is not received in a given period, the count value of the counter is not reset, and the hang detection logic 132 may determine the SoC as in a hang state or a malfunction state or the CPUs 100-1~100-*n* in an inoperable state. In this case, the hang detection logic 132 may provide an interrupt generation command to the interrupt generation logic 134.

The interrupt generation logic 134 may receive an interrupt generation command from the hang detection logic 132 and may output an interruption signal IRQ to the CPUs 100-1~100-*n*. In the present example embodiment, when the hang detection logic 132 determines that one of the CPUs 100-1~100-*n* is in an inoperable state, the interrupt generation logic 134 may output an interruption signal IRQ to the CPUs, besides the CPU that is in an operable state.

The interruption signal IRQ may be output, for example, as a debug request with respect to the CPUs. In the present example embodiment, when the hang detection logic 132 determines that the SoC is in a hang state or a malfunction state, the interrupt generation logic 134 may output an interruption signal IRQ as a debug request with respect to the specific purpose CPUs.

Figure 2C:
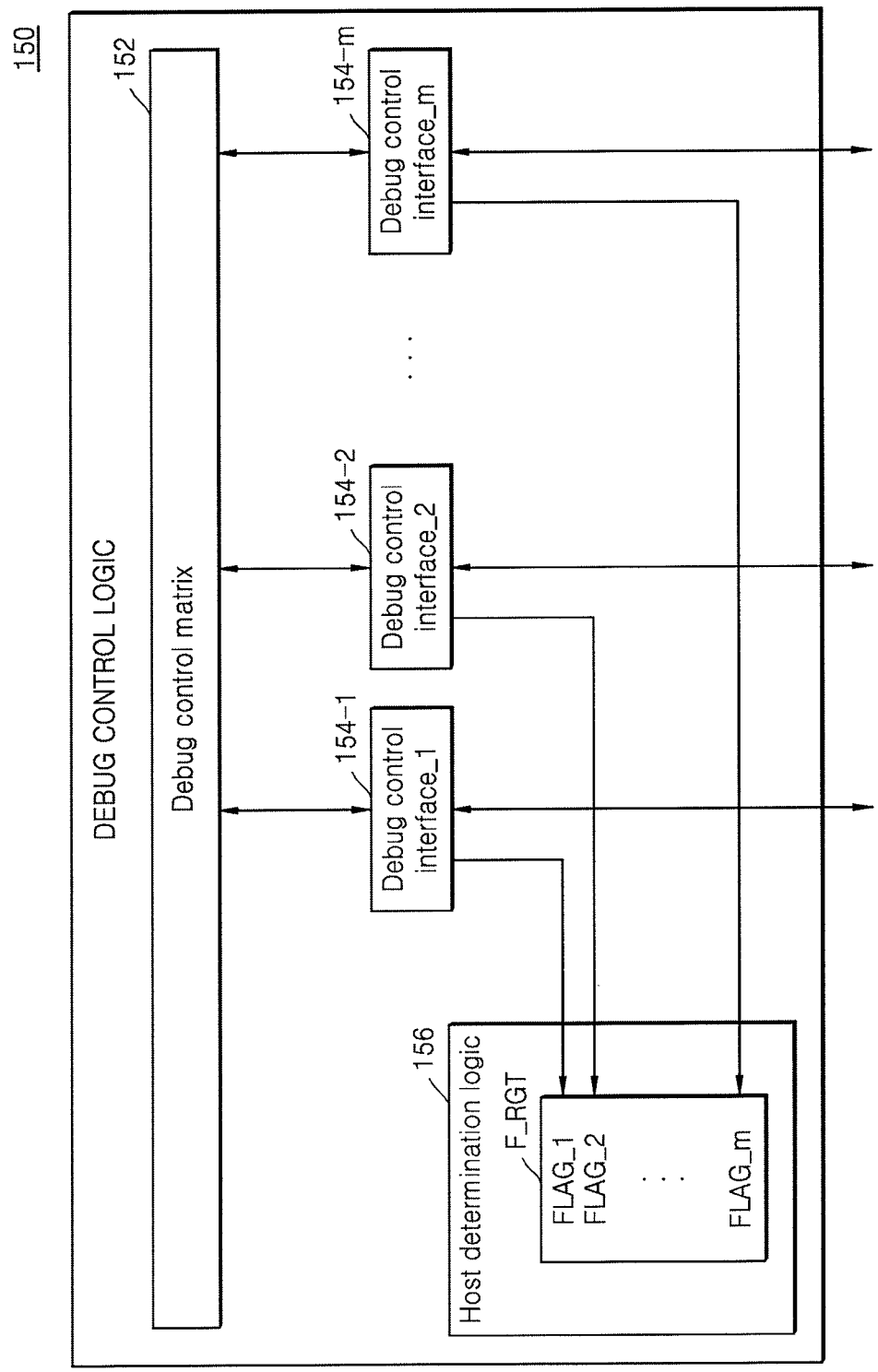
FIG. 2C illustrates an embodiment of practical debug control logic.

FIG. 2C illustrates an embodiment of practical debug control logic 150 which may include a debug control matrix 152, a plurality of debug control interfaces 154-1~154-*m*, and a host determination logic 156.

The debug control matrix 152 may provide connections among the debug control interfaces 154-1~154-*m*. In the present example embodiment, the debug control matrix 152 may broadcast an event signal received through one of the debug control interfaces 154-1~154-*m* to the functional blocks through the debug control interfaces 154-1~154-*m* connected to the debug control matrix 152.

The debug control interfaces 154-1~154-*m* respectively may be connected to the functional blocks and may provide connections of the functional blocks with respect to the debug control matrix 152. For example, the debug control interfaces 154-1~154-*m* may be correspondingly connected to the CPUs 100-1~100-*n* or the memory 120.

The CPUs 100-1~100-*n* may receive a broadcasted event signal from the debug control matrix 152 through the corresponding debug control interfaces 154-1~154-*m*. The CPUs 100-1~100-*n* that receive the broadcasted event signal may access flag information FLAG_1~FLAG_m in host determination logic 156 and may respectively correspond to the debug control interfaces 154-1~154-*m*.

In the present example embodiment, only the CPU that accesses first to the flag information FLAG_1~FLAG_m may change the corresponding flag information. When the flag information is changed, the CPU connected to debug control interfaces 154-1~154-*m* corresponding to the changed flag information may be determined as a debug host. For example, when the first flag information FLAG_1 is changed, the CPU connected to the first debug control interfaces 154-1 corresponding to the first flag information FLAG_1 may be the CPU that firstly has received an event signal. In other words, the CPU of the CPUs 100-1~100-*n* that firstly receives the event signal may be determined as a debug host.

The host determination logic 156 may include a flag resister F_RGT storing flag information FLAG_1~FLAG_m that respectively corresponds to the debug control interfaces 154-1~154-*m*. The flag register F_RGT may be realized as a predetermined memory, for example, a SRAM or a DRAM. The flag information FLAG_1~FLAG_m respectively may be information of 1 bit.

The host determination logic 156 may determine a debug host based on an access result with respect to the flag information FLAG_1~FLAG_m of each of the CPUs 100-1~100-*n*. In the present example embodiment, when one of the flag information FLAG_1~FLAG_m is changed, the host determination logic 156 may determine the CPU connected to a debug control interface corresponding to the changed flag information as a debug host. The debug control interface corresponding to the changed flag information may be a debug control interface that firstly receives a broadcasted event signal from the debug control matrix 152.

Figure 3A:
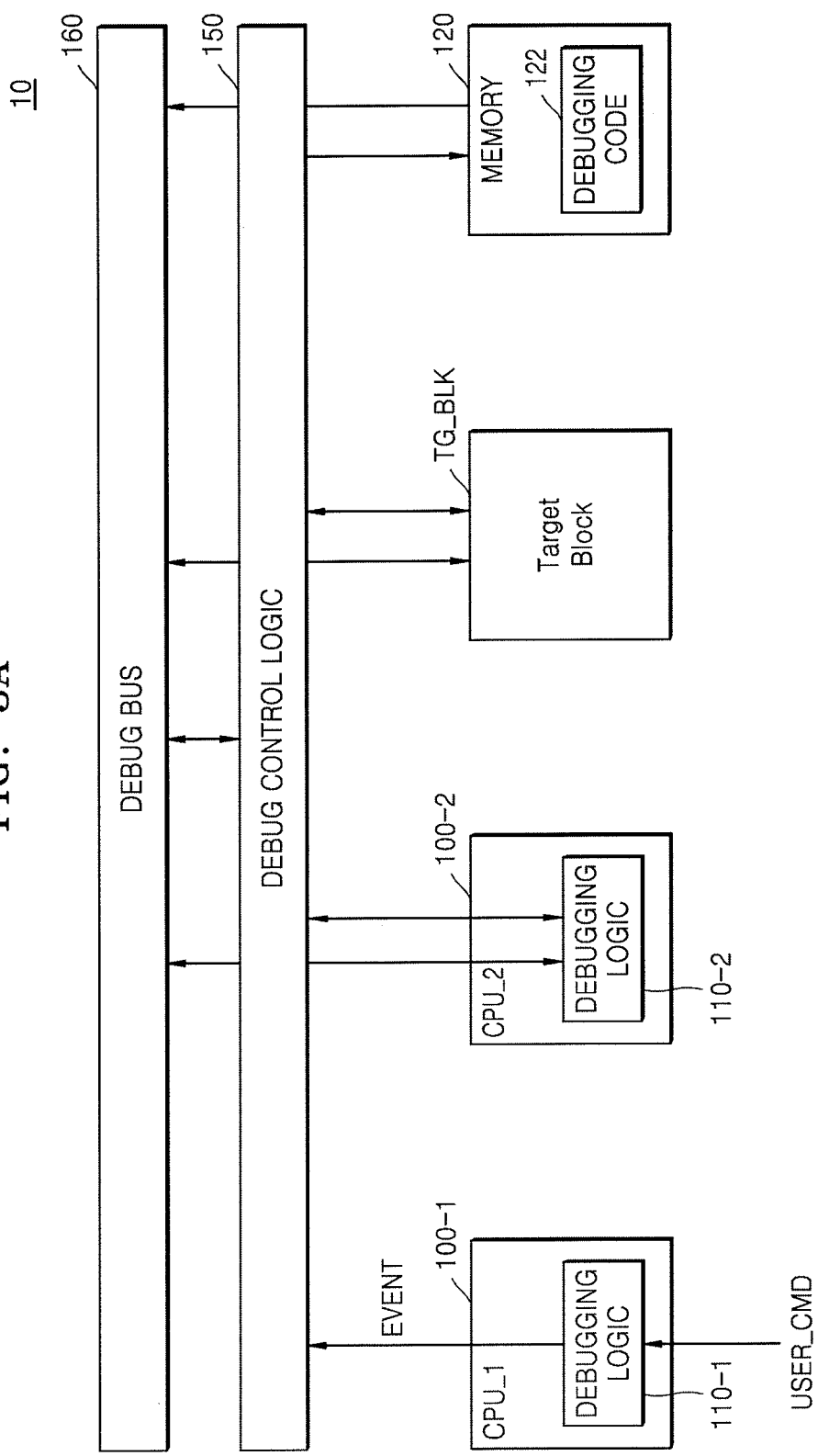
FIGS. 3A to 3C illustrate embodiments of operations of a semiconductor chip.
Figure 3B:
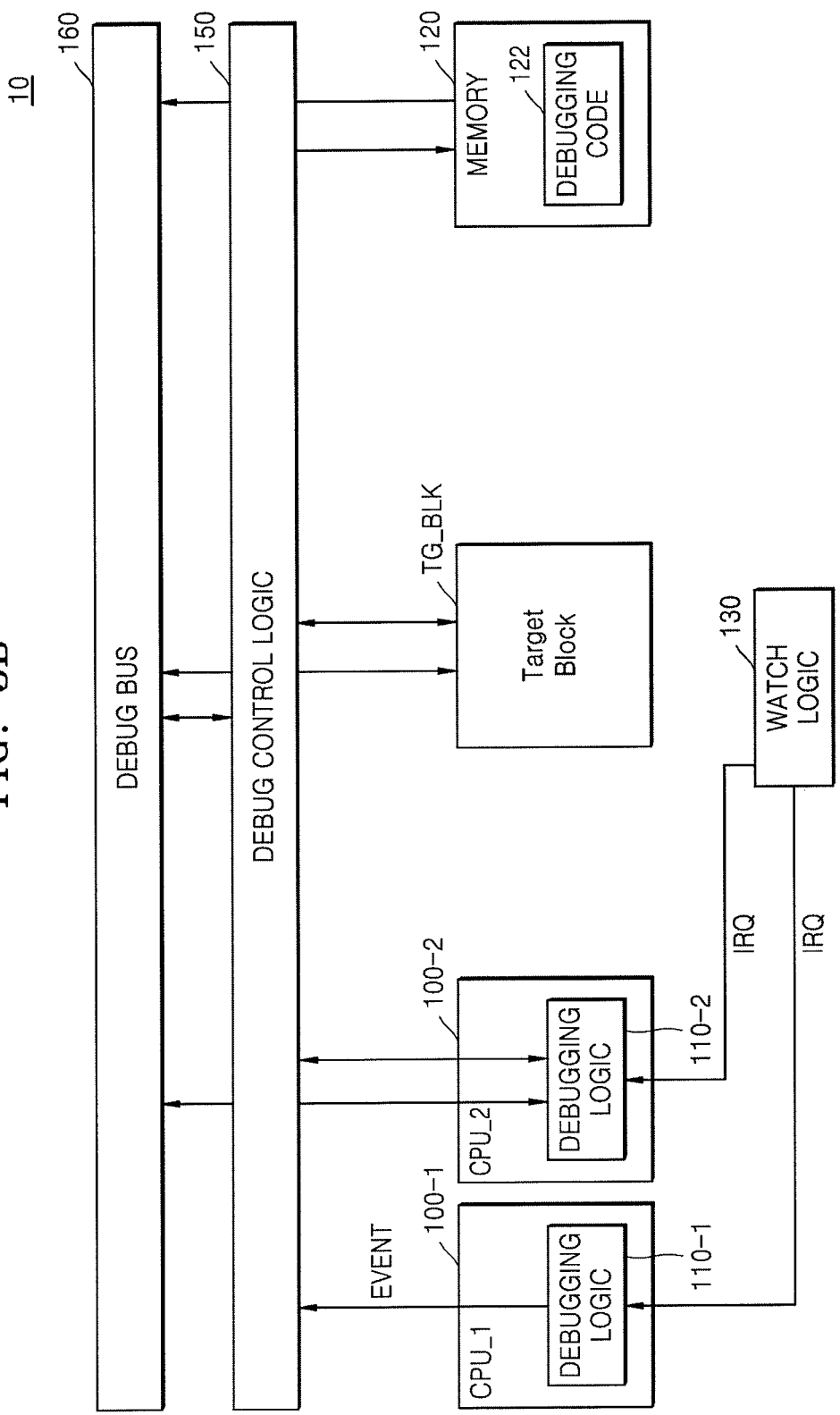
Figure 3C:
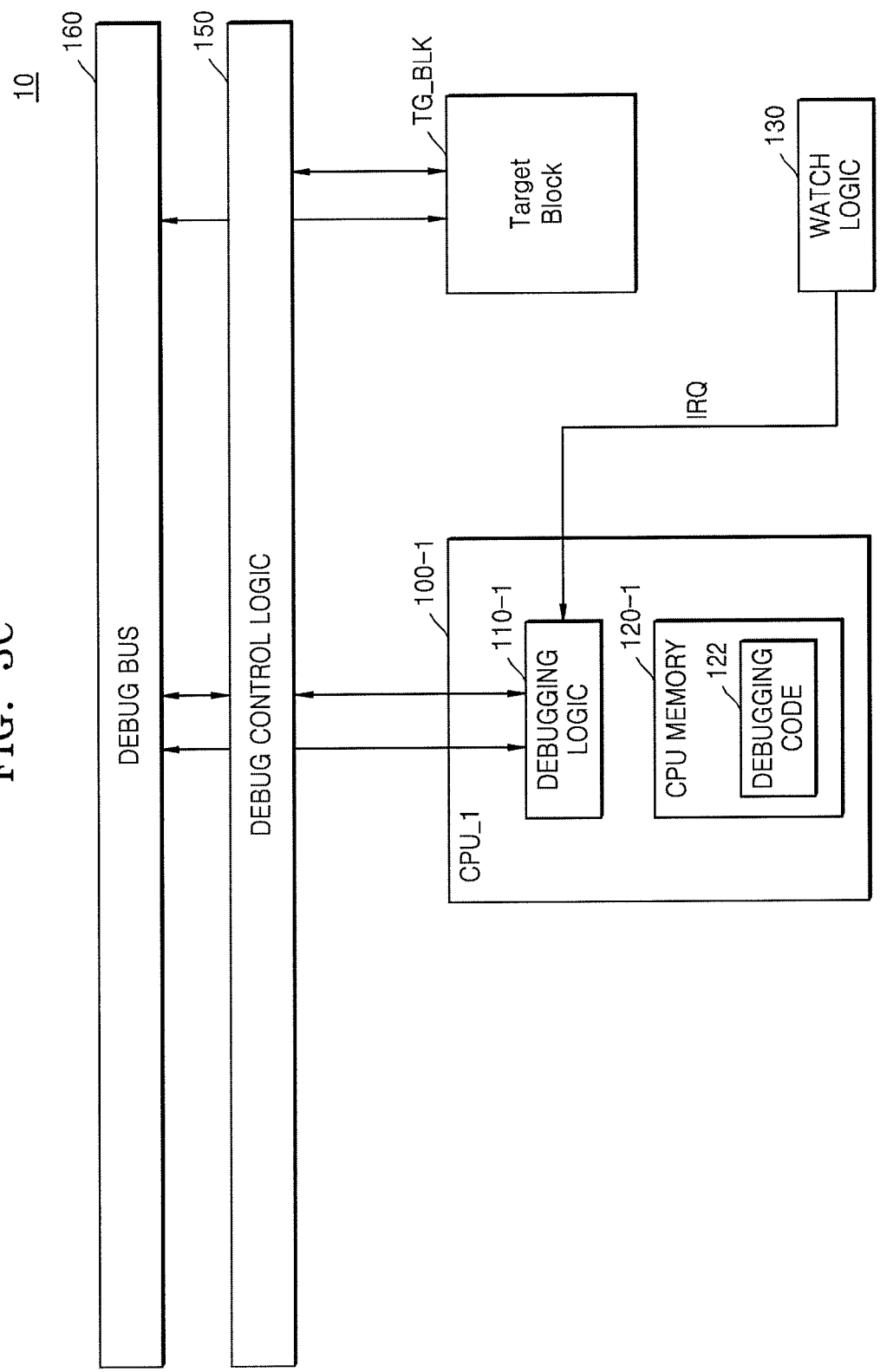

FIGS. 3A to 3C illustrate embodiments of operations of a semiconductor chip, which, for example, may be semiconductor chip 10 in FIG. 1. Referring to FIG. 3A, the first debugging logic 110-1 in the first CPU 100-1 may receive a user command USER_CMD. The user command USER_CMD may be, for example, a signal for requesting a debugging operation. The user command USER_CMD may be, for example, a signal input through a user interface in the semiconductor chip 10. The user interface may be supported through, for example, a universal asynchronous receiver/transmitter (UART) or a Z-modem interface.

The first debugging logic 110-1 may output an event signal EVENT to debug control logic 150 based on the received user command USER_CMD. The debug control logic 150 may broadcast the received event signal EVENT to the CPUs 100-1~100-*n* of the semiconductor chip 10. In the present example embodiment, debug control logic 150 may determine the CPU that firstly receives the broadcasted event signal of the CPUs as a debug host. FIG. 3A shows a case in which the second CPU 100-2 is determined as a debug host.

The second CPU 100-2 determined as a debug host may perform a debug operation with respect to a debug target block TG_BLK. The debug target block TG_BLK may be determined through, for example, a user command USER_CMD input through a user interface. The debug target block TG_BLK may be one of the functional blocks in the semiconductor chip 10.

The second CPU 100-2 as the debug host may perform a debug operation based on debugging code 122 stored in the memory 120. In the present example embodiment, the debugging code 122 stored in the memory 120 may be operated by second debugging logic 110-2 through debug bus 160 according to control of debug control logic 150.

When the second CPU 100-2 performs a debug operation, the second CPU 100-2 may request information from the debug target block TG_BLK through the debug control logic 150. For example, when the second CPU 100-2 requests debug control logic 150 to send information of the debug target block TG_BLK, debug control logic 150 may control the debug target block TG_BLK to output corresponding information. The information output from the debug target block TG_BLK may be provided to second debugging logic 110-2 in the second CPU 100-2 through debug bus 160.

In one example embodiment, when performing a debug operation, the role of the debug bus 160 may be replaced by the system bus 140 (e.g., refer to FIG. 1). For example, debugging code 122 stored in the memory 120 may be executed by second debugging logic 110-2 through the system bus 140 (e.g., refer to FIG. 1) according to control of debug control logic 150. Also, information output from the debug target block TG_BLK may be provided to second debugging logic 110-2 in the second CPU 100-2 through the system bus 140.

Referring to FIG. 3B, a debug request may be initiated from watch logic 130. For example, when the debug target block TG_BLK is a CPU, watch logic 130 may detect whether the debug target block TG_BLK is operable or not. When the debug target block TG_BLK is a memory or a system bus, watch logic 130 may detect whether the SoC is in a hang state or a malfunction state or not. In the present example embodiment, watch logic 130 may receive reset signals at given periods from the functional blocks in the semiconductor chip 10, and thus may detect whether or not CPUs 100-1~100-n are in an operable state or an inoperable state and the SoC is in a hang state or a malfunction state.

In the present example embodiment, when the debug target block TG_BLK is in an inoperable state or the SoC is in a hang state or a malfunction state, watch logic 130 may output an interruption signal IRQ to at least one of the CPUs. A CPU of the CPUs that firstly receives the interruption signal IRQ may output an event signal EVENT to the debug control logic 150 based on the interruption signal IRQ. In FIG. 3B, the case is illustrated where the first CPU 100-1 is the CPU that firstly receives an interruption signal IRQ.

The debug control logic 150 may broadcast the received event signal EVENT to the CPUs 100-1~100-n of the semiconductor chip 10. The subsequent operation of the semiconductor chip 10 may be the same operation described with reference to FIG. 3A.

Referring to FIG. 3C, a debug request for initiating a debugging may be generated at watch logic 130. However, unlike in FIG. 3B, the first CPU 100-1, which serves as a debug host that receives the interruption signal IRQ corresponding to a debug request, may perform a debug operation. In the present example embodiment, the first CPU 100-1 of the CPUs may be a CPU that has firstly received the interruption signal IRQ. In the present example embodiment, the first CPU 100-1 may be one of the CPUs that responds to the interruption signal IRQ output from watch logic 130.

The first CPU 100-1 serving as the debug host may perform a debug operation with respect to the debug target block TG_BLK. The debug target block TG_BLK may be, for example, the memory 120 or the system bus 140. In the present example embodiment, when the debug target block TG_BLK is the memory 120 or the system bus 140, watch logic 130 may be in a detection state whether the SoC is in a hang state or a malfunction state or not.

In the present example embodiment, the first CPU 100-1 may include debugging logic 110-1 and a CPU memory 120-1. The CPU memory 120-1 may be, for example, a cache memory. The CPU memory 120-1 may store debugging code 122. The first debugging logic 110-1 may perform a debug operation with respect to the debug target block TG_BLK based on the debugging code 122 stored in the CPU memory 120-1. The first CPU 100-1 may be, for example, a specific-purpose CPU, e.g., a DSP or sensor CPU.

When a debug operation is performed, the first CPU 100-1 may request the debug target block TG_BLK information through the debug control logic 150. In the present example embodiment, when the debug target block TG_BLK is the system bus 140, the first CPU 100-1 may request the system bus 140 for information of a special function register (SFR) in the system bus 140 through the debug control logic 150. Information from the debug target block TG_BLK may be provided to first debugging logic 110-1 in the first CPU 100-1 through the debug bus 160.

According to the present example embodiment, the semiconductor chip 10 may perform a debug operation through a CPU in the semiconductor chip 10. Thus, debugging costs may be reduced and limitations on debugging functions may be reduced or minimized. Also, the operating method of the semiconductor chip 10 according to the current example embodiment may provide the convenience of testing products, because debugging may be performed without opening or decomposing the products in the case of testing mass product.

Figure 4:
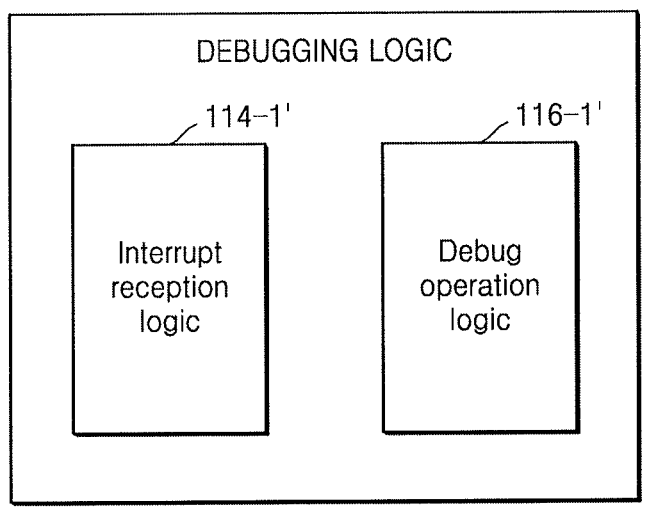
FIG. 4 illustrates another embodiment of practical debugging logic.

FIG. 4 illustrates another embodiment of practical debugging logic, which, for example, may be representative of one or more of the debugging logics in FIG. 1. Referring to FIG. 4, debugging logic 110-1' may include an interrupt reception logic 114-1' and a debug operation logic 116-1'. The interrupt reception logic 114-1' may receive, for example, an interruption signal IRQ from watch logic 130 (e.g., refer to FIG. 1). The interrupt reception logic 114-1' may output a debug initiation signal to the debug operation logic 116-1' based on the received interruption signal IRQ. In the present example embodiment, when interrupt reception logic 114-1' is able to output a response signal with respect to the interruption signal IRQ, the interrupt reception logic 114-1' may output a debug initiation signal to the debug operation logic 116-1'.

Figure 5:
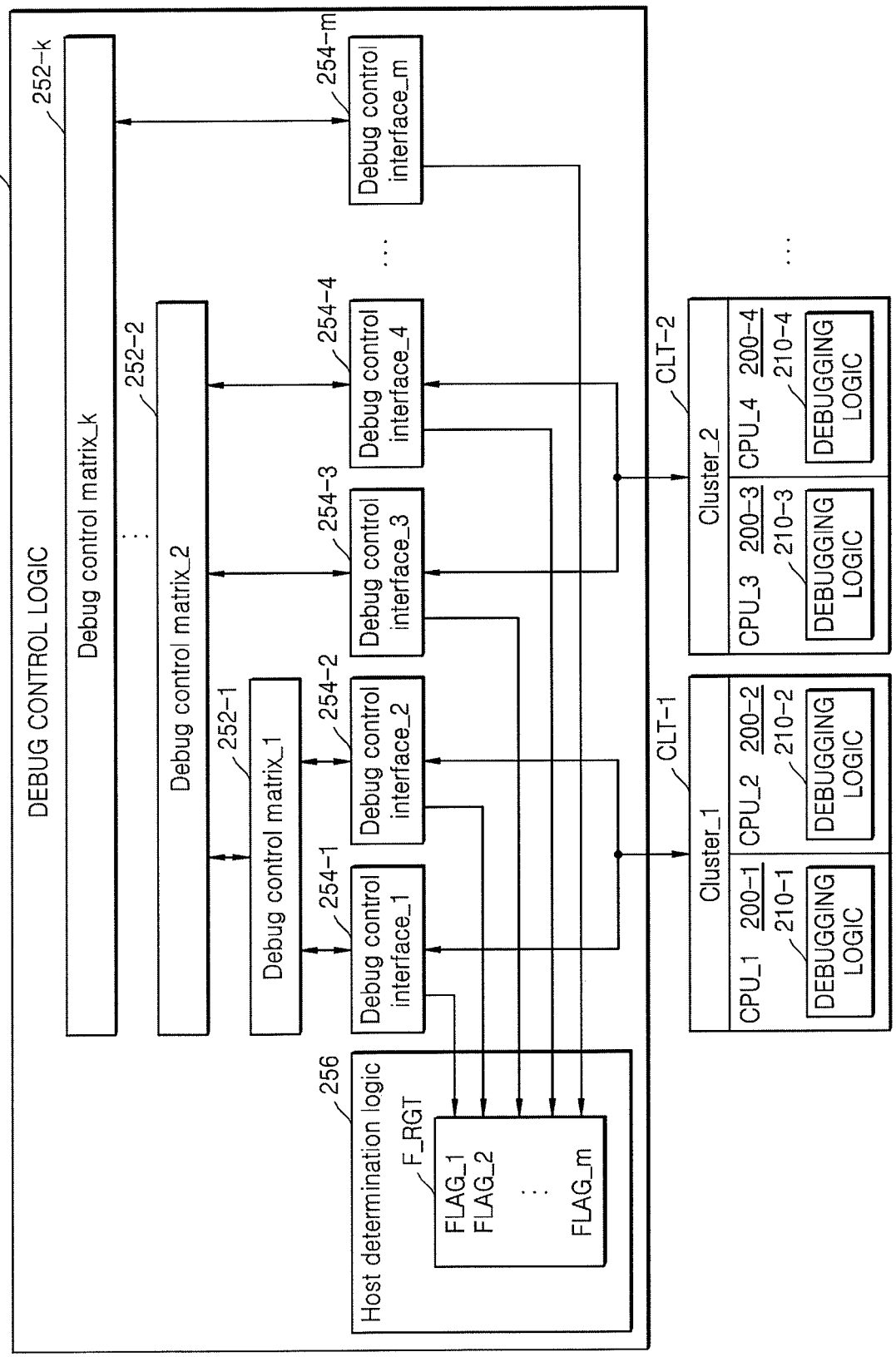
FIG. 5 illustrates another embodiment of a semiconductor chip.

FIG. 5 illustrates another embodiment of a semiconductor chip 20 which may include a first cluster CLT-1, a second cluster CLT-2, and a debug control logic 250. The first cluster CLT-1 and the second cluster CLT-2 may be heterogeneous clusters from each other. In FIG. 5, for convenience, a partial configuration of the semiconductor chip 20 is depicted. The semiconductor chip 20 may further include other constituent elements in addition to the depicted constituent elements.

The first cluster CLT-1 may include a first CPU 200-1 and a second CPU 200-2. The first CPU 200-1 and the second CPU 200-2 in the first cluster CLT-1 may be, for example, big cores. The first and second CPUs 200-1 and 200-2 are processing clusters and may form the first cluster CLT-1. In the present example embodiment, the first cluster CLT-1 may have an operating frequency higher than that of the second cluster CLT-2. The first cluster CLT-1 may use a pipeline wider than that of the second cluster CLT-2 and may have a relatively high performance to the second cluster CLT-2.

The first and second CPUs 200-1 and 200-2 respectively may include first and second debugging logics 210-1 and 210-2. The first and second debugging logics 210-1 and 210-2 may include the configuration of FIG. 2A or FIG. 4.

The second cluster CLT-2 may include a third CPU 200-3 and a fourth CPU 200-4. The third CPU 200-3 and the fourth CPU 200-4 in the second cluster CLT-2 may be, for example, little cores. The third CPU 200-3 and the fourth CPU 200-4 are processing clusters and may constitute the second cluster CLT-2.

In the present example embodiment, the second cluster CLT-2 may have an operating frequency lower than that of the first cluster CLT-1. The second cluster CLT-2 may use a pipeline narrower than that of the first cluster CLT-1 and may have a relatively lower performance or power than the first cluster CLT-1.

The third CPU 200-3 and the fourth CPU 200-4 respectively may include third and fourth debugging logics 210-3 and 210-4. The third and fourth debugging logics 210-3 and 210-4 may have the same configuration of FIG. 2A or FIG. 4.

The debug control logic 250 may include debug control matrixes 252-1~252-k, debug control interfaces 254-1~254-m, and host determination logic 256. In the present example embodiment, the first debug control matrixes 252-1 may provide a connection between the first and second debug interfaces 254-1 and 254-2. The second debug control matrix 252-2 may provide a connection between the first debug control matrix 252-2 and the third and fourth debug control interfaces 254-3 and 254-4. In the same manner, the debug control matrixes 252-1~252-$k$ may provide connections with respect to the debug control interfaces 254-1~254-$m$ to each other.

In the present example embodiment, the debug control matrixes 252-1~252-$k$ respectively may firstly output an event signal received through one of the directly connected debug control interfaces 254-1~254-$m$ to the directly connected other debug control interfaces. For example, when the event signal is output from first debugging logic 210-1 of the first CPU 200-1, the first debug control matrix 252-1 may receive the corresponding event signal through the first debug control interface 254-1. In this case, the first debug control matrix 252-1 may firstly output the received event signal to the second CPU 200-2 through the second debug control interface 254-2.

At this point, when the second CPU 200-2 is in normal operation, the second CPU 200-2 may perform a debug operation as a debug host. When the second CPU 200-2 is in an inoperable state or a debug target block, the event signal may be output to the second debug control matrix 252-2 through the first debug control matrix 252-1, and the second debug control matrix 252-2 may output the received event signal to the third CPU 200-3 and the fourth CPU 200-4 through the third and fourth debug control interfaces 254-3 and 254-4. One of the third CPU 200-3 or the fourth CPU 200-4 that firstly receives the event signal may perform a debug operation as a debug host.

The debug control interfaces 254-1-254-$m$ may respectively be connected to the corresponding first or second functional blocks. The first or second functional blocks may be connected to the debug control matrixes 252-1~252-$k$ through respective debug control interfaces 254-1~254-$m$.

For example, the first and second debug control interfaces 254-1 and 254-2 may respectively be connected to the first and second CPUs 200-1 and 200-2 in the first cluster CLT-1. The third and fourth debug control interfaces 254-3 and 254-4 may respectively be connected to the third and fourth CPUs 200-3 and 200-4 in the second cluster CLT-2. For example, the first and second debug control interfaces 254-1 and 254-2 may provide a connection between the first cluster CLT-1 and the first debug control matrix 252-1. The third and fourth debug control interfaces 254-3 and 254-4 may provide a connection between the second cluster CLT-2 and the second debug control matrix 252-2.

The host determination logic 256 may include a flag register F_RGT in which flag information FLAG_1~FLAG_m respectively corresponding to the debug control interfaces 254-1~254-$m$ are stored. The host determination logic 256 may have the same configuration, for example, as the host determination logic 156 of FIG. 2C.

Figure 6:
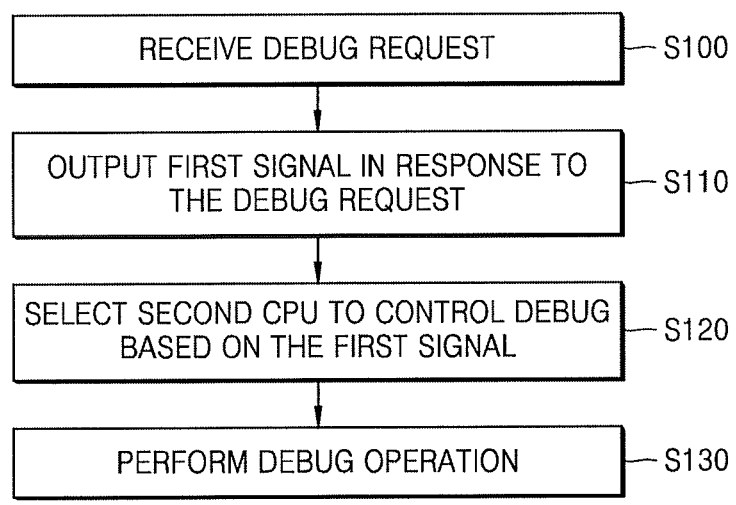
FIG. 6 illustrates an embodiment of an operation of a semiconductor chip.

FIG. 6 illustrates an embodiment of an operation of the semiconductor chip 10. Referring to FIGS. 1 and 6, at least one of the CPUs 100-1~100-$n$ in the semiconductor chip 10 may receive a debugging request (S100). In the present example embodiment, a debugging may be requested as a user command input through a user interface. In one example embodiment, a debugging operation may be requested as an interrupt signal output from the watch logic 130.

A first CPU that receives the debugging request may output a first signal based on the debugging request (S110). In the present example embodiment, the first signal may be an event signal. In one example embodiment, the first signal may be an interrupt response signal that includes information regarding a response of normal or abnormal of the at least one of the CPUs 100-1~100-$n$. After outputting the first signal by the CPU, a second CPU for controlling a debug may be selected based on the first signal (S120). Afterwards, the second CPU may perform a debug operation with respect to a debug target block as a debug host (S130).

Figure 7:
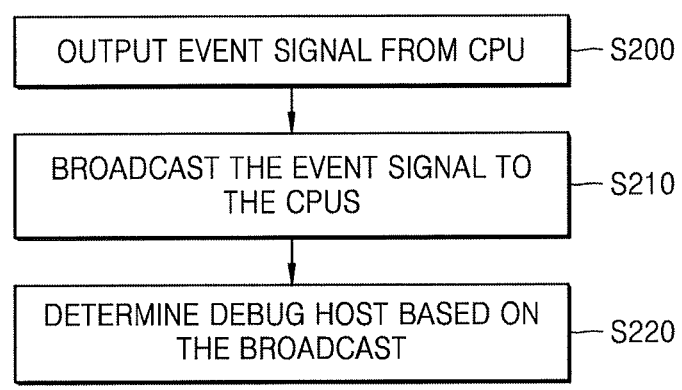
FIG. 7 illustrates an embodiment of a practical operation of a semiconductor chip.

FIG. 7 illustrates an embodiment of a practical operation of the semiconductor chip 10. The practical operation may be, for example, the operation of the semiconductor chip 10 of FIG. 3A or 3B.

Referring to FIG. 7, when at least one of the CPUs 100-1~100-$n$ in the semiconductor chip 10 receives a debug request signal, the corresponding CPU may output an event signal (S200). In the present example embodiment, when debugging is requested as a user command input through a user interface, the CPU that outputs the event signal may be a CPU connected to the user interface. In one example embodiment, when debugging is requested through an interruption signal IRQ output from watch logic 130, the CPU that outputs the event signal may be the CPU that firstly receives the interruption signal IRQ.

After the event signal is output, the output event signal may be broadcast to the CPUs 100-1~100-$n$ (S210). In the present example embodiment, the debug control logic 150 in the semiconductor chip 10 may receive the event signal and broadcast the event signal to each of the CPUs 100-1~100-$n$.

After broadcasting the event signal to the CPUs 100-1~100-$n$, a debug host may be determined among the CPUs 100-1~100-$n$ based on the broadcast (S220). In the present example embodiment, the host determination logic 156 in the debug control logic 150 may determine a CPU that firstly receives the broadcasted event signal among the CPUs 100-1~100-$n$ as a debug host. The CPU determined as the debug host may perform a debug operation with respect to debug target blocks.

Figure 8:
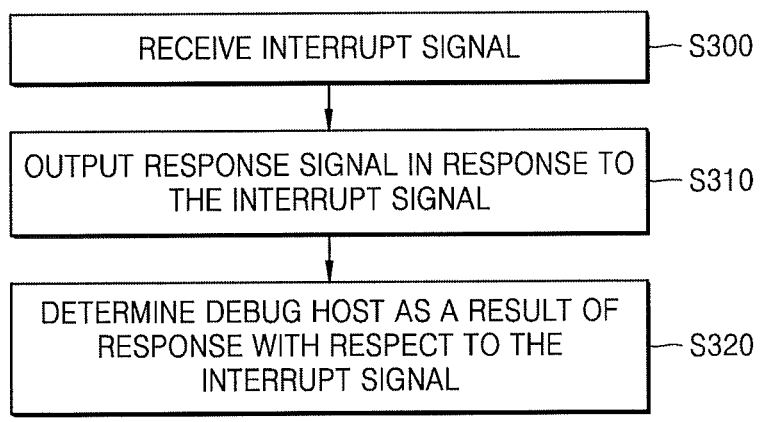
FIG. 8 illustrates an embodiment of a practical operation of a semiconductor chip.

FIG. 8 illustrates another embodiment of a practical operation of the semiconductor chip. The practical operation may be of the semiconductor chip 10 of FIG. 3C.

Referring to FIG. 8, at least one of the CPUs 100-1~100-$n$ in the semiconductor chip 10 may receive an interruption signal IRQ (S300). When one of the CPUs 100-1~100-$n$ is in an inoperable state or the SoC is in a hang state or a malfunction state, the interruption signal IRQ may be outputted from the watch logic 130.

Next, the CPUs that receive the interruption signal IRQ may output a response signal with respect to the interruption signal IRQ (S310). In the present example embodiment, the response signal with respect to the interruption signal IRQ may include information regarding a response of normal or abnormal of the CPU with respect to the interruption signal IRQ. In one example embodiment, the response signal with respect to the interruption signal IRQ may include information of the CPU that firstly receives the interruption signal IRQ.

After outputting the response signal with respect to the interruption signal IRQ, a debug host may be determined according to the response result with respect to the interruption signal IRQ (S320). In the present example embodiment, a CPU that has responded as a normal with respect to the interruption signal IRQ may be determined as the debug host. In one example embodiment, a CPU that firstly receives the interruption signal IRQ may be determined as the debug host.

Figure 9:
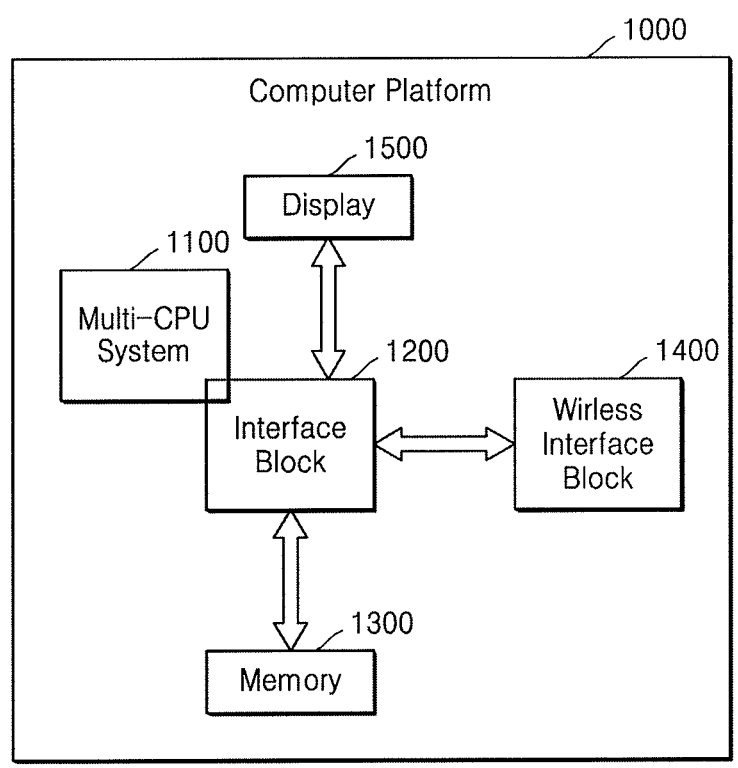
FIG. 9 illustrates an embodiment of a computer platform.

FIG. 9 illustrates an embodiment of a computer platform 1000 which may be used for electronic devices such as a computing system. The electronic devices may be realized, for example, as personal computers (PCs), digital TVs, or portable devices.

The computer platform 1000 may include a multi-CPU system 1100, an interface block 1200, and a memory 1300. In one example embodiment, the computer platform 1000 may further include at least one of a wireless interface block 1400 and a display 1500. The multi-CPU system 1100 may communicate with the memory 1300 and the wireless interface block 1400 or the display 1500. As described with reference to FIGS. 1 to 8, one CPU of CPUs of the multi-CPU system 1100 may be determined as a debug host according to a debug requests signal. The CPU determined as the debug host may perform a debug operation with respect to debug target blocks.

The interface block 1200 may include one or more circuit blocks that may perform various interface control functions. The interface control functions may include a memory access control, a graphic control, an input/output interface control, or a wireless network access control. The circuit blocks respectively may be realized, for example, as independent chips, as parts of the multi-CPU system 1100, or in an internal of the multi-CPU system 1100.

The memory 1300 may exchange data with the multi-CPU system 1100 through the interface block 1200. The wireless interface block 1400 may connect the computer platform 1000 to a wireless network, for example, a mobile communication network or a local area network (LAN) through an antenna.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The logic, processors, and other signal generating and signal processing features of the disclosed embodiments may be implemented in logic which, for example, may include hardware, software, or both. When implemented at least partially in hardware, the logic, processors, and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the logic, processors, and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A method of operating a system-on-chip (SoC) that includes at least a first central processing unit (CPU) and a second CPU, each of the first and second CPUs being operable to perform a debug operation on a debug target block that is a different functional block of the SoC, the method comprising:
   receiving a debug request by the first CPU;
   outputting a first signal by the first CPU based on the debug request, the first signal being an event signal to initiate debugging;
   broadcasting the event signal to each of the first and second CPUs;
   selecting the second CPU as a debug host that performs a debug operation on the debug target block; and
   performing the debug operation on the debug target block by the second CPU, wherein:
   selecting the second CPU includes selecting the second CPU based on a result of receiving the broadcasted event signal with respect to the first and second CPUs,
   the SoC includes a flag register storing flag information respectively corresponding to the first and second CPUs, and
   selecting the second CPU further includes:
      changing at least one of the flag information respectively corresponding to the first and second CPUs based on the received result; and
      selecting a CPU corresponding to the at least one of the changed flag information of the first and second CPUs as the second CPU.

2. The method as claimed in claim 1, wherein:
   the SoC includes a user interface, and
   receiving the debug request includes receiving the debug request through the user interface.

3. The method as claimed in claim 1, wherein:
   the SoC includes watch logic to detect whether or not the first and second CPUs are in an operable state or an inoperable state, and to detect whether or not the SoC is in a hang state or a malfunction state, and
   receiving the debug request includes receiving an interrupt signal as the debug request from the watch logic when at least one of the first and second CPUs is in an inoperable state or the SoC is in a malfunction state.

4. The method as claimed in claim 1, wherein the first CPU is a CPU that firstly receives the debug request.

5. The method as claimed in claim 1, wherein the second CPU is a CPU that firstly receives the broadcasted event signal from the first CPU.

6. The method as claimed in claim 1, wherein:
the SoC includes a memory storing a debugging code, and
performing the debug operation includes performing the debug operation by the second CPU with respect to the debug target block based on the debugging code.

7. The method as claimed in claim 1, wherein:
the second CPU includes a CPU memory to store a debugging code, and
the debug operation is performed by the second CPU with respect to the debug target block based on the debugging code when the SoC is in a malfunction state.

8. The method as claimed in claim 1, wherein performing the debug operation includes stopping operations besides the debug operation with respect to the first and second CPUs.

9. A system-on-chip (SoC), comprising:
a plurality of first functional blocks;
a plurality of second functional blocks, each of the plurality of second functional blocks including:
an event generation logic to output an event signal to initiate debugging, and
a debug performing logic operable to perform a debug operation on a debug target block that is a different functional block of the SoC; and
debug control logic to receive the event signal from a first one of the plurality of second functional blocks and to broadcast the event signal to the plurality of second functional blocks, wherein:
a second one of the plurality of second functional blocks is selected based on result of receiving the broadcasted event signal with respect to the plurality of second functional blocks such that the second one of the plurality of second functional blocks operates as a debug host that performs the debug operation on the debug target block,
the SoC includes a flag register storing flag information respectively corresponding to the first and second ones of the plurality of second functional blocks,
at least one of the flag information corresponding to the first and second ones of the plurality of second functional blocks is changed based on the received result, and
the second one of the plurality of second functional blocks is selected as the debug host in correspondence with the at least one of the changed flag information.

10. The SoC as claimed in claim 9, wherein:
the second one of the plurality of second functional blocks, which is to perform the debug operation, firstly receives the broadcasted event signal from the debug control logic.

11. The SoC as claimed in claim 9, further comprising:
watch logic to detect whether or not the plurality of first functional blocks and the plurality of second functional blocks are in an operable state or an inoperable state, or to detect whether or not the SoC is in a malfunction state or not, and to output an interrupt signal to the plurality of second functional blocks when at least one of the plurality of first functional blocks and the plurality of second functional blocks is in an inoperable state or the SoC is in a malfunction state.

12. The SoC as claimed in claim 11, wherein:
the second one of the plurality of second functional blocks, which firstly receives the interrupt signal, is to output the event signal.

13. The SoC as claimed in claim 9, further comprising:
a memory to store a debugging code,
wherein the second one of the plurality of second functional blocks, which performs the debug operation, is to perform a debug operation on the debug target block based on the debugging code.

14. A system-on-chip (SoC), comprising:
a plurality of processors, each of the processors being operable to perform a debug operation on a debug target block that is a different functional block of the SoC;
a memory to store a debugging code;
a debug control logic to receive an event signal from a second processor of the plurality of processors and to broadcast the event signal to the plurality of processors;
first logic to select a first processor of the plurality of processors based on result of receiving the broadcasted event signal with respect to the plurality of processors such that the first processor operates as a debug host that performs a debug operation based on the debugging code; and
a flag register storing flag information respectively corresponding to the first and second processors, wherein:
at least one of the flag information corresponding to the first and second processors is changed based on the received result, and
the first processor is selected as the debug host in correspondence with the at least one of the changed flag information.

15. The SoC as claimed in claim 14, further comprising second logic to detect an error of one of the plurality of processors or the SoC and to generate a reset signal when the error is detected.

16. The SoC as claimed in claim 15, wherein:
the error of the one of the plurality of processors is whether the one of the plurality of processors is in an inoperable state, and
the error of the SoC is a hang state or a malfunction state.

17. The SoC as claimed in claim 15, wherein the second processor is to output the event signal to the debug control logic based on the reset signal of the second logic.

* * * * *